US012577359B2

(12) United States Patent
Jaritz

(10) Patent No.: US 12,577,359 B2
(45) Date of Patent: Mar. 17, 2026

(54) METHODS FOR COATING TECHNOLOGY FOR PLASTIC CONTAINERS

(71) Applicant: Ionkraft GmbH, Augsburg (DE)

(72) Inventor: Montgomery Jaritz, Bornheim (DE)

(73) Assignee: Ionkraft GmbH

( * ) Notice: Subject to any disclaimer, the term of this patent is extended or adjusted under 35 U.S.C. 154(b) by 0 days.

(21) Appl. No.: 18/843,207

(22) PCT Filed: Feb. 27, 2023

(86) PCT No.: PCT/EP2023/054778
§ 371 (c)(1),
(2) Date: Aug. 30, 2024

(87) PCT Pub. No.: WO2023/165913
PCT Pub. Date: Sep. 7, 2023

(65) Prior Publication Data
US 2025/0163231 A1 May 22, 2025

(30) Foreign Application Priority Data

Mar. 3, 2022 (DE) ..................... 10 2022 105 041.6

(51) Int. Cl.
| | |
|---|---|
| C23C 16/02 | (2006.01) |
| C08J 7/048 | (2020.01) |
| C23C 16/04 | (2006.01) |
| C23C 16/40 | (2006.01) |
| C23C 16/511 | (2006.01) |
| C23C 16/515 | (2006.01) |

(52) U.S. Cl.
CPC ............. C08J 7/048 (2020.01); C23C 16/029 (2013.01); C23C 16/045 (2013.01); C23C 16/401 (2013.01); C23C 16/511 (2013.01); C23C 16/515 (2013.01)

(58) Field of Classification Search
CPC ... C23C 16/029; C23C 16/045; C23C 16/401; C23C 16/511; C23C 16/515
See application file for complete search history.

(56) References Cited

U.S. PATENT DOCUMENTS

| | | | | |
|---|---|---|---|---|
| 8,372,491 | B2 * | 2/2013 | Rostaing | C23C 16/511 |
| | | | | 427/569 |
| 9,139,908 | B2 * | 9/2015 | Ranade | C23C 16/45523 |
| 9,263,677 | B2 * | 2/2016 | Fukuda | C23C 16/402 |
| 2002/0172763 | A1 * | 11/2002 | Plester | B05D 1/62 |
| | | | | 427/237 |
| 2003/0215652 | A1 * | 11/2003 | O'Connor | C23C 16/401 |
| | | | | 428/523 |
| 2009/0148633 | A1 | 6/2009 | Inagaki | |
| 2013/0211344 | A1 * | 8/2013 | Rodriguez | A61M 5/31513 |
| | | | | 604/230 |
| 2014/0318611 | A1 * | 10/2014 | Moslehi | H10F 77/219 |
| | | | | 438/98 |

| | | | | |
|---|---|---|---|---|
| 2015/0171230 | A1 * | 6/2015 | Kapur | H10F 10/146 |
| | | | | 438/98 |
| 2017/0236954 | A1 * | 8/2017 | Kramer | H10F 10/165 |
| | | | | 136/256 |
| 2019/0015561 | A1 | 1/2019 | Wills | |
| 2019/0127846 | A1 * | 5/2019 | Tudhope | C23C 16/45565 |

FOREIGN PATENT DOCUMENTS

| | | | | | |
|---|---|---|---|---|---|
| CN | | 1695257 | A * | 11/2005 | ............. H01L 51/20 |
| DE | | 42 38 279 | A1 | 5/1994 | |
| DE | | 44 45 427 | A1 | 6/1996 | |
| DE | | 197 32 217 | C2 | 12/2002 | |
| DE | | 101 39 305 | A1 | 3/2003 | |
| DE | | 10323453 | A1 * | 12/2004 | ........... C23C 16/511 |
| DE | 10 2009 046 947 | | A1 | 5/2011 | |
| EP | | 3093309 | B1 * | 3/2018 | ............... C08J 7/04 |
| EP | | 3 680 098 | A1 | 1/2019 | |
| KR | | 20160098165 | A * | 8/2016 | ........... C23C 16/455 |
| TW | | 201229306 | A | 7/2012 | |
| TW | | 202105478 | A * | 2/2021 | ............. H01L 21/28 |
| WO | WO 0194448 | | A2 * | 12/2002 | |

OTHER PUBLICATIONS

Deilmann, Michael, et al., "Silicon Oxide Permeation Barrier Coating and Plasma Sterilization of PET Bottles and Foils". Plasma Processes and Polymers, 2009, 6, 5695-5699.*

Nakaya, M., et al., "Gas and flavor barrier thin film coating to plastic closures". Quarterly Physics Review, vol. 4, Issue 1, Jan. 2018, pp. 1-17.*

Nakaya, Masaki, et al., "Recent Progress in Gas Barrier Thin Film Coatings on PET Bottles in Food and Beverage Applications". Coatings 2015, 5, 987-1001.*

Yin, Lianhua, "Preparation of High-barrier Polyethylene Terephthalate bottle by Microwave Plasma Enhanced Chemical Vapor Deposition". MATEC Web of Conferences 358, 01002 (2022), pp. 1-5.*

Zhao, Yuan, et al., "Effectiveness of PECVD deposited nano-silicon oxide protective layer for polylactic acid film: Barrier and surface properties". Food Packaging and Shelf Life, 25 (2020) 100513, pp. 1-8.*

German Patent Office, "International Search Report & Written Opinion", issued in connection with International Patent Application No. PCT/EP2023/054778, dated Sep. 7, 2023 (18 pages).

(Continued)

*Primary Examiner* — Bret P Chen
(74) *Attorney, Agent, or Firm* — Holland & Hart LLP

(57) ABSTRACT

Methods for plastic coating by means of plasma-enhanced chemical vapor deposition (PECVD) are described. In particular, the methods described can be used to coat recyclable plastic containers for storing aggressive chemicals with a stable migration barrier. A process and a coating are described. With the process, a coating can be deposited from a process gas mixture of at least one precursor and a reactive gas which is excited to form a plasma. By adjusting the reactive gas content in the process gas mixture and varying the mass-related excitation energy, a gradient coat can be deposited on the plastic substrate to produce a chemically resistant migration barrier.

19 Claims, 4 Drawing Sheets

(56)     References Cited

OTHER PUBLICATIONS

German Patent Office, "Search Report", issued in connection with German Patent Application No. 10 2022 105 041.6, dated Nov. 29, 2022 (16 pages).
European Patent Office, "International Preliminary Report on Patentability", issued in connection with International Patent Application No. PCT/EP2023/054778, dated Sep. 3, 2024 (14 pages).

* cited by examiner

METHODS FOR COATING TECHNOLOGY FOR PLASTIC CONTAINERS

CROSS REFERENCE

The present application for Patent claims priority to International Patent Application No. PCT/EP2023/054778 by Jaritz, entitled "COATING TECHNOLOGIES FOR PLASTIC CONTAINERS," filed Feb. 27, 2023, which claims priority to German Application No. DE2022/ 10105041 by Jaritz, entitled "COATING TECHNOLOGIES FOR PLASTIC CONTAINERS," filed Mar. 3, 2022, each of which is assigned to the assignee hereof, and each of which is expressly incorporated by reference in its entirety herein.

TECHNICAL FIELD

The following relates to plastic coating by means of plasma enhanced chemical vapor deposition (PECVD).

BACKGROUND

In industry, plastic containers, e.g. bottles or canisters, are used to store a wide variety of liquids. The properties of the plastic affect the suitability of the material for storing the respective medium as well as the manufacturing costs of the container.

The suitability of the material depends in particular on the permeation properties of the plastic with regard to various gases (e.g. oxygen from the ambient air), solvents, aromatics, dyes or other substances as well as the resistance of the plastic to the medium to be stored (e.g. acidic or alkaline media).

For safe storage of the medium, e.g. an alkaline solution, the medium should be protected from penetrating substances from the environment or the loss of substances. The contents of the container must not enter the environment. However, depending on the properties of the container material, gases and other substances can diffuse through the container wall (permeation). The barrier performance of the container material describes how well the container or the stored medium is protected against permeation.

In addition, the medium itself should not leak out of the container or damage the container. The material of the container must be able to withstand the medium to be stored over a longer period of time and ensure sufficient storage safety. Particularly when storing chemicals, many of which are classified as hazardous goods, high demands are placed on the resistance of the container materials.

In principle, the production of containers from plastic, e.g. by extrusion blow molding, is a popular approach in the industry, as it allows the containers to be manufactured cost-effectively and plastic containers are easy to store. However, the state of the art knows of no cost-effective plastic that simultaneously offers sufficient barrier performance and resistance to aggressive, particularly alkaline or acidic, media.

In the prior art, therefore, plastics or special composite plastics that are expensive to manufacture or complex to transport or store are often not used for storing aggressive media.

Containers produced by coextrusion blow molding are often used, the walls of which consist of several layers of different plastics. A mixture of hard polyethylene (HD-PE), polyamide (PA) and/or ethylene-vinyl alcohol copolymer (EVOH) is often used. HD-PE is highly resistant to acids, alkalis, oils and fats, but has a high permeability to certain substances, which is why EVOH and/or PA are used. This packaging made of composite plastics is not environmentally friendly, as only monomaterial solutions can be recycled sustainably.

In addition to the use of non-recyclable plastic multi-material solutions, the only other options for barrier finishing of plastics are fluorination or coating using plasma technology. In fluorination, the containers are placed in a vacuum chamber and exposed to a fluorine gas mixture in the absence of atmosphere. Due to its high reactivity, fluorine partially replaces hydrogen atoms on the surface of the material. However, this only creates an adsorption barrier, which can only prevent the migration of media such as solvents. Fluorine is also toxic and highly corrosive, which makes this technology unattractive and expensive. Furthermore, there are more and more studies that attribute negative environmental and health effects to fluorinated plastics.

Plasma polymer coatings, on the other hand, are not only inexpensive, they can also be produced using harmless chemicals and require only a small amount of energy and materials. PECVD can be used to produce fluorine-free silicon-based barrier coatings that can act as a passive barrier to prevent the migration of any substances. This makes the coatings suitable as a solvent barrier, a barrier against the migration of any contaminants from a plastic recyclate into a filling material or as a gas barrier against oxygen, hydrogen or carbon dioxide, for example, which opens up a wide range of possible applications.

In some examples, a process for PEVCD may include coating of hollow bodies at low pressure, which is now widely used in industry. First, the entire vacuum chamber together with the bottle to be coated is evacuated to the required working pressure. The process gases are then introduced into the interior of the bottle and excited to form a plasma using microwaves. The plasma ignites inside the bottle and a barrier coating can be applied.

Compared to competing processes for permeation reduction, plasma-polymer coatings are not only inexpensive but also environmentally friendly, as only a small amount of energy and material is required for their production and solvents or other harmful chemicals can be dispensed with. This applies in particular to low-pressure plasma processes due to their closed reaction space and the minimal amount of process gas used.

The silicon oxide SiOx-barrier coatings may be susceptible to hydrolysis, so that they decompose even on contact with filling materials with slightly increased pH values>7.

In some examples, a multilayer composite coating may include a SiOx barrier layer and an organosilicon passivation layer.

A potential disadvantage of these multilayer composite coatings, whose layers are built up one after the other (often in separate process steps), is that defects and pores in an underlying layer propagate as defects in a subsequent coating due to the layer growth mechanisms typical of PECVD processes, so that such layer systems always have an open porosity.

Such PECVD processes for depositing a barrier layer against gas permeation and a protective passivation layer on plastic containers (so-called composite coatings) are mainly used today in the beverage industry.

For certain filling goods, e.g. aggressive alkaline chemicals, which require a high mechanical stability of the containers, a high barrier performance against gases and solvents as well as a high resistance against acidic and alkaline media, the known composite coatings are not suitable or at least in need of optimization.

The growth processes of the different layers of the composite coating create pores in the coating surface. Among other things, these pores cause gaps in the passivation layer through which the underlying barrier layer is exposed to the aggressive medium. Pores can be caused in particular by so-called island growth during coating deposition. Island growth prevents homogeneous layer formation.

Layer growth in PECVD is a complex process in its entirety and is characterized to a large extent by the competition between kinetics and thermodynamics. At the beginning of the coating process in PECVD, layer-forming particles are accelerated towards the substrate surface. After impact, they are reflected back from the surface if the kinetic energy is too low. If the kinetic energy is high enough, they are adsorbed as adatoms. Such adatoms then diffuse over the surface of the substrate until they either desorb again or condense with other adatoms, form nuclei and find their final position in the coating. The surface energy of the surface to be coated contributes significantly to the mobility of the adatoms and thus to the type of layer growth. If the surface energies of the coating material and substrate material are similar, homogeneous layer growth is favored.

Island growth occurs above all when the substrate has a lower surface energy than the layer being formed, as a result of which the interaction between substrate and adatom is lower than the interaction between the particles. The layered material then preferably grows in three-dimensional islands. Since the condensation of atoms on the substrate is not initially thermodynamically favored in this growth mode, closed layers only form during island growth as the layer growth progresses and the islands grow together.

Furthermore, depending on the plasma process and reactor type, a different number of collisions occur in the plasma until the reactive particles reach the substrate. With few collisions, only a few reactions take place in the gas phase, so that the deposition rate decreases. If the particles or radicals carry out many impacts or reactions until they reach the substrate, volume polymerization can occur, in which oligomers are already formed in the gas phase. The larger the particles, the lower the probability of surface diffusion, so that island growth occurs more frequently and the layers are later closed, as the islands first have to grow together.

Island growth thus leads to a granular surface structure and subsequently to nanoscopic pores at the grain boundaries of the coalescing islands. When several grain boundaries meet, pores are formed. The lateral extent of the pores is in the range of several nanometers. This means that these layer defects are much larger than molecular oxygen or ions in an alkaline solution, for example, and therefore represent weak points in the layer system.

If such pores are located in an underlying SiOx layer (barrier layer), increased nucleation occurs at these, so that agglomerates form here, which results in a continuation of these layer defects into a possible subsequent protective layer (passivation layer).

Experiments have shown that a large number of nanoscopic pores always form in SiOx layers deposited on plastic or organosilicon adhesion promoter layers, which can be detected using electrochemical methods such as cyclic voltammetry or electrochemical impedance spectroscopy.

This can be explained, among other things, by the different surface energies and chemical configurations of the materials, as well as increased volume polymerization. Measurements of existing pores after the further application of an organosilicon passivation layer on the SiOx layers showed that the number of nanoscopic pores hardly decreases due to the further coating.

When using some composite coatings, pore- or defect-driven failure of the system therefore occurs when exposed to chemically aggressive media. Through open pores, this can reach the hydrolysis-prone barrier layer beneath the passivation layer and begin to decompose it. This leads to infiltration of the protective layer and failure of the entire system. This layer system is therefore not suitable for the industrial storage of chemicals.

One approach to solving these problems of composite coatings is the use of so-called gradient coats, in which the chemical configuration changes gradually along the layer thickness between organic (passivation or adhesion promotion) and oxidic (migration barrier). In contrast to composite coats, which consist of a few (micro) layers with sharply different materials, gradient coats have a continuous gradient in the material composition along the thickness of the coat.

Gradient coats are known from other areas of technology, e.g. as an anti-scratch layer on plastic spectacle lenses.

In some cases, the plasma pulsation parameter can be used to generate a PECVD gradient coat with otherwise constant parameters. However, this parameter is only suitable for the deposition of scratch protection layers, for example, for which no major differences in chemical configuration are required, so that the same gas composition can be used throughout the entire layer deposition.

SUMMARY

The known processes are not sufficient to produce a non-porous gradient coat that can cover a broad spectrum of chemical configuration from highly oxidized (SiOx) for barrier to organosilicon (SiOCH) for corrosion protection.

In particular, changing the pulse quotients alone is not sufficient to achieve the desired bandwidth between barrier and passivation effect in a continuous gradient coat and at the same time ensure homogeneous pore-free coating growth.

The present disclosure makes it possible to deposit an advantageous gradient coat in which the pulse parameters, in particular the quotient of switch-on time and switch-off time, are not necessarily first increased and then reduced. Rather, research has shown that the targeted control of the energy density in the plasma as a function of the gas composition has a significant influence on the coating properties. For example, it is possible to control the energy density in the plasma with at least an initially constant quotient between the switch-on time and switch-off time of the pulses by means of the energy supply, the absolute duration of the pulses and/or the gas composition.

The gradient coats, e.g. anti-scratch coatings, are also unsuitable due to their mechanical properties. Scratch protection layers with a thickness of more than one micrometer, often more than two or three micrometers, tend to crack under mechanical stress or break at stressed points, so that the chemical protective effect suffers.

Further development of the processes already developed in the 1990s for the deposition of gradient coats was also limited by the high reaction times of approx. 0.5 seconds of the mass flow controllers available on the market. It was not possible to form pore-free gradient coats with a gradient resolution of a few nanometers using the technology available at the time.

It is therefore the task of the present disclosure to demonstrate an improved coating technique for plastic containers.

It has been shown that special process conditions and coating properties are necessary to form a chemically resistant coating with good barrier performance.

In order to be able to form a sufficiently high chemical resistance for the storage of chemicals, organosilicon coatings with a high carbon content may be produced, preferably by retaining methyl groups from the precursor.

Plasma polymer layers deposited from organosilicon precursors (e.g. silicon oxide barrier layers) consist of silicon, carbon, hydrogen, oxygen and/or nitrogen. The typical resistance of such layers to alkaline media, for example, is due to the high electronegativity difference between oxygen/nitrogen and silicon, as ions in solution primarily break bonds with high partial charge shifts. The more inorganic or oxidized the layers are, the more positive partial charges are present on carbon and especially silicon atoms. As the electronegativity difference between silicon and oxygen is greater than between silicon and carbon, silicon has the largest positive partial charge, which makes these bonds and thus the often used SiOx barrier layers particularly susceptible.

Research has shown that within a narrow process window of energy density in the plasma, gas composition, process pressure and temperature, it is possible to preserve the methyl groups contained in the precursor, e.g. hexamethyldisiloxane (HMDSO) molecule, in the plasma, prevent volume polymerization and thus incorporate them into the layers. In view of the structural formula and the binding energies in the HMDSO molecule, PECVD of HMDSO in plasma first results in cleavage of the methyl groups and then of the hydrogen. Normally, these groups are fragmented in the plasma, react with other particles to form volatile components and leave the reaction space without participating in the layer formation.

By retaining the methyl groups, increased stability of the layers can be achieved through the mechanism of action of steric shielding. Steric shielding refers to the spatial shielding of a weak bond by neighboring, space-filling substituents. In organic chemistry, a substituent is an atomic group (organyl residue or other residue) that replaces a hydrogen atom in a molecule (here the methyl groups).

The use of oxygen as a reactive gas for the deposition of a chemically resistant passivation layer must therefore be limited or even avoided. However, the addition of a large amount of oxygen is absolutely necessary to produce oxide SiOx layers (barrier layer). Generating both functional layers only by controlling the energy introduced (e.g. via the pulse parameters of the plasma excitation) during the process is therefore inadequate.

The disclosure relates to both the coating and the process for producing the coating.

A first aspect of the present disclosure is to use a gradient coat deposited by PECVD with at least one oxidically characterized barrier zone and an organically characterized passivation zone for the coating of a plastic container for aggressive media (e.g. alkalis).

The gradient coat is composed of a large number of nanolayers with a resolution of a few nanometers (up to 1 nanometer), the material composition of which changes gradually from nanolayer to nanolayer. Along the layer thickness, the material composition gradually changes from organic to oxidic or vice versa. Within a nanolayer, the material composition of the layer is essentially homogeneous. The material composition of the individual nanolayers is determined by the process control of the PECVD process.

The barrier zone is characterized by oxidation and provides a high barrier performance to prevent permeation of gases through the container wall. Preferably, the barrier zone has a high concentration of Si—O—Si compounds.

The passivation zone is organically characterized and offers high resistance to aggressive media, especially alkaline media. The passivation zone is preferably arranged on a barrier zone and protects the barrier zone from environmental influences, in particular from aggressive media within the container. Preferably, the passivation zone has a high concentration of organic compounds, preferably CH3 and/or CH2 compounds, and a low concentration of oxidic compounds, in particular a low concentration of Si—OH and Si—O—Si compounds.

Depending on the type of plastic substrate to which the coating is to be applied, it is advantageous to deposit an organically characterized adhesion zone between the plastic substrate and the oxidic barrier zone.

A coating with an adhesion zone is usually applied to polyolefins. On certain plastics, e.g. PET, the adhesion zone can be dispensed with.

In a first example, the gradient coat comprises at least one oxidic barrier zone and an organic passivation zone (2-zone layer). In a further example, the gradient coat comprises an organic adhesion zone, an oxidic barrier zone and an organic passivation zone (3-zone layer).

The different zones gradually merge into one another. The zones form a continuous gradient coat with smooth transitions between the zones. The zones preferably have an oxide or organic center located either in the middle region of the zone or in the edge region of the zone, depending on whether it is an edge zone of the gradient coat or a zone within the gradient coat. In certain examples, the coating may comprise multiple gradient coats. The gradient coat may also comprise multiple zones of the same type (passivation zone, barrier zone or adhesion zone).

A particular advantage of the gradient coat over composite coats is that the coats can be formed particularly homogeneously, i.e. without pores and with low residual stresses. During the deposition of the individual nanolayers, chemically similar nanolayers always meet, which prevents island growth.

The gradually merging zones can be separated from each other in different ways. Preferably, the zones are separated from each other by the proportion of organic or oxidic compounds. The gradient coat is made up of a large number (approx. 80-1000) of nanolayers with a thickness of a few nanometers. If the proportion of oxidic compounds predominates in a nanolayer, this nanolayer can be assigned to the barrier zone. If the organic compounds predominate in a nanolayer, this nanolayer can be assigned to the passivation or adhesion zone.

A further aspect of the present disclosure is to vary the concentration of the reactive gas used, preferably oxygen, during the deposition of the gradient coat in order to achieve a sufficiently strong gradient between the oxidic barrier zone and the organic passivation zone or adhesion zone.

To deposit the gradient coat in the PECVD process, a process gas mixture is fed into a previously evacuated reaction space in which the plastic substrate is arranged. The process gas mixture comprises one or more silicon-containing precursors, preferably hexamethyldisiloxane (HMDSO) and/or hexamethyldisilazane (HMDSN). The process gas mixture also comprises, at least intermittently, one or more reactive gases, preferably oxygen. In certain examples, further auxiliary gases, e.g. noble gases, may be added.

The composition, i.e. the mixing ratio, of the process gas mixture is dynamically adjustable, preferably by means of mass flow controllers. In particular, the reactive gas mass flow, the precursor mass flow and the ratio of the two mass flows to each other can be regulated. In certain examples, several precursors and/or reactive gases can be used. In these cases, the ratio of the individual precursor mass flows to each other can also be controlled. Preferably, the ratio between reactive gas mass flow and precursor mass flow is regulated.

The reactive gas content C can be described in particular by the following formula:

$$C = \frac{RGF}{PGF}$$

C: Reactive gas content
RGF: Reactive gas mass flow
PGF: precursor mass flow

The precursor mass flow can result from the sum of the mass flows of several precursors.

An increase in the addition of reactive gas, in particular oxygen, to the process, i.e. an increase in the reactive gas content C, causes a higher degree of fragmentation of silicon-containing monomers and greater oxidation of the deposited layers. The oxidation of the layers in turn correlates with the barrier effect and the hydrolytic stability of the layers.

By controlling the reactive gas content, preferably the oxygen content, the material composition and thus the function of the deposited nanolayers can be controlled over a broader spectrum. In this way, a high barrier effect and strong passivation can be achieved with a homogeneous, i.e. pore-free, layer structure.

A further aspect of the present disclosure is to control the excitation energy during the deposition of the gradient coat specifically in relation to the process gases involved in the reaction. In particular, the excitation energy is controlled on a mass-related basis depending on the composition of the process gas mixture. The targeted adjustment of the mass-related excitation energy prevents volume polymerization, which can also prevent the formation of pores.

In plasma-assisted chemical vapor deposition, the process gas mixture is excited by an energy source to form a plasma. A magnetron is preferably used as the energy source. The excitation preferably takes place by microwaves. Preferably, the plasma is excited in a pulsed manner. The pulsed excitation can prevent the plastic substrate from being heated too much by the plasma.

The plasma excitation supplies energy to the reaction of the process gases. The mass-related excitation energy describes the energy that is supplied to the reaction per particle mass. By specifically adjusting the energy supplied per particle mass, a particularly homogeneous layer deposition can be achieved.

It has been shown that completely pore-free layers can be deposited if the excitation energy supplied to the reaction is controlled as a function of the process gas mixture. Preferably, the mass-related excitation energy in the respective zones of the gradient coat is set in a specific process window as a function of the respective reactive gas content.

To calculate the mass-related excitation energy, it is advantageous to correct the mass flow of the process gases involved in the reaction with a correction factor to take into account the reactivity of the reactive gas. The correction factor for oxygen is K=0.6 and for nitrogen K=0.5.

The mass-related excitation energy, also known as energy density, can be described using the following formula:

$$E = \frac{Pp}{Fc} = \frac{P \times \frac{ton}{ton + toff}}{PGF + K \times RGF} [J\,kg^{-1}]$$

E: mass-related excitation energy (energy density) [J/kg]
$P_p$: average pulse power [J/s]
Fc: corrected process gas flow [kg/s]
P: Power [J/s]
$t_{on}$: pulse on-time [s]
$t_{off}$: Pulse off-time [s]
PGF: Precursor mass flow [kg/s]
RGF: Reactive gas mass flow [kg/s]

In an example, a relatively high mass-related excitation energy, preferably 400 kJ/kg s E≤2700 kJ/kg, particularly preferably 1800 kJ/kg≤E≤2200 kJ/kg, is supplied to deposit the barrier zone at a relatively high reactive gas content, preferably with 25≤C≤250, particularly preferably with 50≤C≤100.

To deposit the passivation zone, a relatively low to medium mass-related excitation energy, preferably 30 kJ/kg≤E≤1700 kJ/kg, particularly preferably 500 kJ/kg≤E≤800 kJ/kg, is supplied at a relatively low reactive gas content, preferably 0≤C≤20, particularly preferably 0≤C≤10.

To deposit the optional adhesion zone, a relatively low mass-related excitation energy, preferably 20 kJ/kg≤E≤200 kJ/kg, particularly preferably 30 kJ/kg≤E≤140 kJ/kg, is supplied at a relatively low to medium reactive gas content, preferably 0≤C≤50, particularly preferably 0≤C≤30.

The interval limits mentioned here are disclosed both in combination and individually and contribute to the technical effect of the disclosure. Thus, the respective lower or upper limit of the interval is also expressly disclosed independently.

A further aspect of the present disclosure is to form the gradient coat, in particular the individual zones, sufficiently thin. Advantageously, the total thickness of the coating is less than 1000 nanometers. Preferably, the coating is up to 500 nanometers thick.

A thin coating has a lower layer stress. The lower layer stress reduces the risk of cracks forming in the coating or the coating breaking under mechanical stress. In contrast to thicker gradient coats in the area of scratch protection coatings (e.g. for spectacle lenses), the requirements in terms of mechanical load-bearing capacity are higher in the area of plastic containers. Thin-walled plastic containers are generally soft. Deformation of the container may occur during storage or transportation (e.g. in the event of impact or stacking). Such deformations must not lead to failure of the coating. It turns out that thin coatings with a thickness of less than 1000 nanometers, preferably less than 500 nanometers, are particularly suitable for plastic containers, especially for storing aggressive media.

The zones formed in the gradient coat also preferably have a thickness optimized for their function and/or the coating formation process.

The thickness of the optional adhesion zone is preferably a maximum of 10 nanometers. The adhesion zone is preferably thinner than the barrier zone or the passivation zone. Such a thin adhesion zone is sufficient to protect the plastic substrate from the oxidative degradative influence of the oxygen-rich plasma for the deposition of the barrier zone. Increasing the thickness of the adhesion zone can lead to increased pore formation during the deposition of the subsequent barrier zone. A thin adhesion zone with a maximum thickness of 10 nanometers is therefore advantageous for homogeneous layer formation. Such a thin adhesion zone forms as homogeneous a basis as possible for the deposition of the subsequent barrier zone.

The barrier zone preferably has a maximum thickness of 100 nanometers. The thin barrier zone is sufficient to form a sufficient migration barrier. At the same time, homogeneous layer growth is possible. Preferably, the barrier zone is thinner than the passivation zone. A thinner barrier zone is advantageous for crack-free layer growth.

Highly oxidized layers grow with intrinsic layer stresses. The organically characterized passivation layer, on the other hand, grows almost free of layer stresses and can therefore be thicker.

The passivation zone has a preferred thickness of up to 800 nanometers. As the passivation zone must ensure sufficient protection of the barrier zone against the influence of aggressive media in the container, the passivation zone can be thicker than the barrier zone.

The coating can be made up of one or more gradient coats. The structure of the gradient coat described above can be repeated in several contiguous gradient coats to increase the protective effect. A zone located at the edge of the coating usually has its organic or oxidic center at the outer end, i.e. facing the medium or substrate. A zone located inside a gradient coat usually has an oxidic or organic center in the middle.

In contrast to the consecutive application of different layer types in a composite layer, the coating material in a gradient coat always has a chemically similar surface, so that layer growth is favored and the formation of pores at coalescing islands is prevented.

Adjusting the gas flows, i.e. the composition of the process gas mixture, allows the required chemical configuration of barrier and passivation zones to be set. The targeted control of the energy introduced per molecule as a function of the process gas mixture further prevents volume polymerization in order to prevent large oligomers from participating in the layer formation and creating pores.

The process according to the present disclosure can thus be used to produce layers that have a high barrier performance against gases and other permeants and at the same time a high stability against aggressive media or other environmental influences, as the upper layers are chemically stable and at the same time pore-free.

Depending on the surface quality, volume and weight of the container, barrier improvements of a factor of 50 to 2000 can be achieved for polyethylene containers coated with the gradient coats in relation to the oxygen permeation rate. Furthermore, the gradient coats remain resistant even after prolonged storage in a highly alkaline NaOH solution or similar aggressive chemicals and the barrier remains intact. This means that they can be used to make packaging made from classic packaging plastics such as PE or PET suitable for storing sensitive chemicals.

Instead of silicon, other suitable semi-metals or metals are also conceivable for use with the disclosure. The present disclosure is not limited to silicon-based starting materials or coatings. Alternatively or in addition to the preferred precursors HMDSO and HMDSN, other (semi-)metallic monomers can also be used. Also, other reactive gases, e.g. nitrogen, may be used as an alternative to or in addition to oxygen. The disclosure also includes examples in which, instead of the preferred process gases, the alternatives mentioned herein or known to the person skilled in the art for PECVD are used.

BRIEF DESCRIPTION OF THE DRAWINGS

Further advantageous examples are described below with reference to the drawings.

The present disclosure is illustrated schematically and by way of example in the drawings. They show.

DETAILED DESCRIPTION

Figure 1:
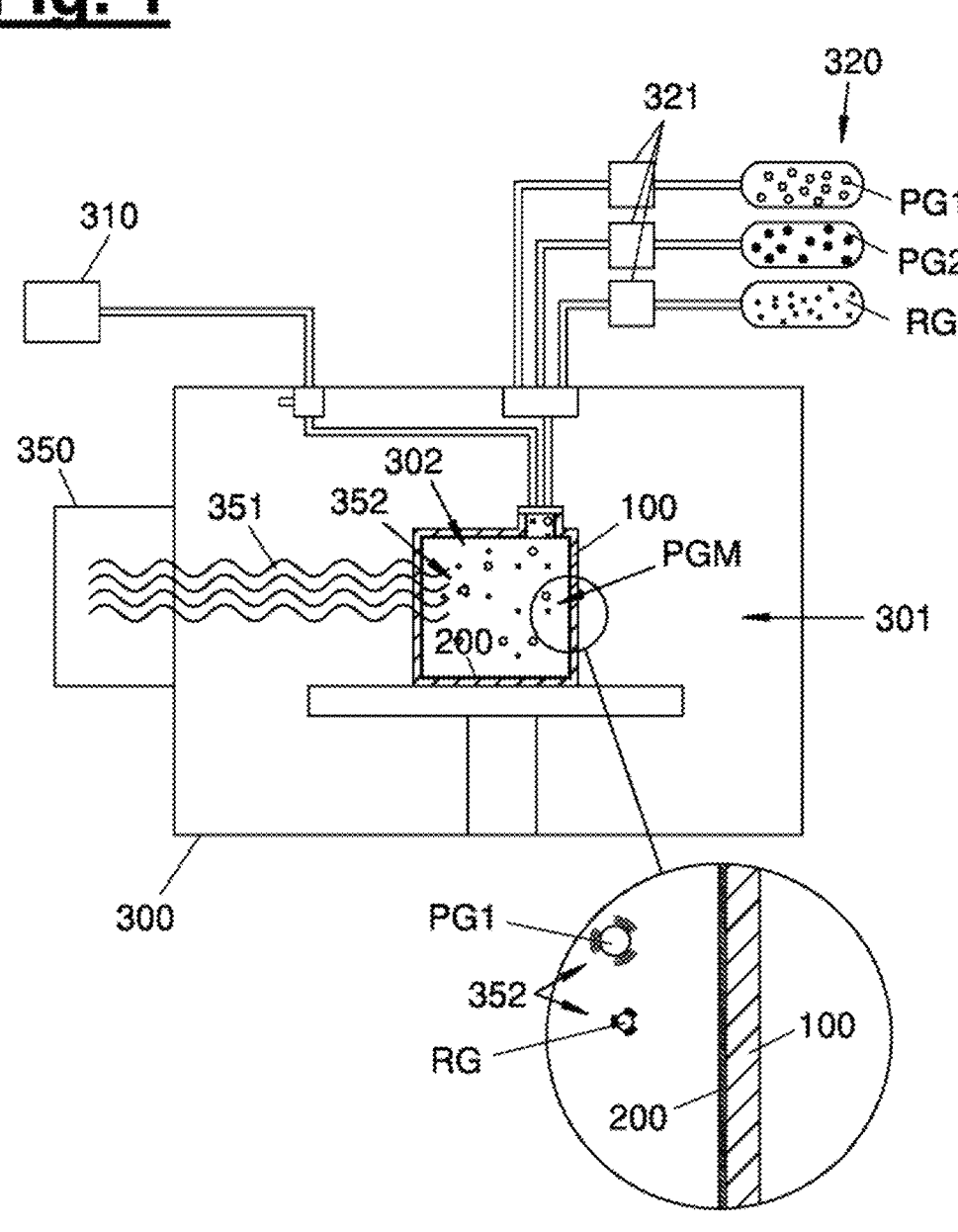
FIG. 1: Structure of a reactor.

FIG. 1 shows a schematic structure of a reactor (300). The reactor (300) comprises a process chamber (301). The substrate (100) is arranged in the process chamber (301). A reaction space (302) is formed in or on the plastic substrate (100). The reaction space (302) can be evacuated by a pump (310). In the example shown, the reaction space is formed inside the container (100) in order to coat the inside of the plastic container (100), for example a canister.

A process gas mixture (PGM) is fed into the reaction space (302) via lines. The reactor comprises a gas supply (320) and one or more gas flow controllers (321), preferably mass flow controllers. The process gas mixture (PGM) is composed of one or more process gases (PG1, PG2, RG), the mixing ratios of which can be controlled.

In an example, two precursors are used. The first precursor (PG1) is preferably HMDSN. The second precursor (PG2) is preferably HDMSO.

One or more precursors (PG1, PG2) can be used in particular for a specific zone of the gradient coat. It is particularly advantageous to use (predominantly) HMDSO as a first precursor for the deposition of the adhesion zone (201) and/or the passivation zone (203). Alternatively or additionally, it is particularly advantageous to use (predominantly) HMDSN as a second precursor for the deposition of the barrier zone (202).

In particular in the transition between two zones of the gradient coat, two or more precursors can be mixed at least temporarily.

The precursor gas mass flow is preferably related to the sum of the mass flows of the multiple precursors. In the case of chemically similar precursors (e.g. HMDSN and HMDSO), the mass flows of the individual precursors in the process gas mixture can be combined to form a calculated precursor gas mass flow for determining the mass-related excitation energy. In some examples, it may be useful to weight the individual gas mass flows with a factor.

Preferably, oxygen is used as the reactive gas (RG). Alternatively or additionally, nitrogen may be used as (further) reactive gas (RG).

In the reaction space (302), the process gas mixture (PGM) is excited by means of an energy source (350). Preferably, a magnetron is used as the energy source (350). The plasma is preferably excited by pulsed microwaves (351). Alternatively or additionally, ICP plasmas can also be used.

The coating (200) is deposited on the plastic container (100) from the process gas mixture excited to the plasma (352).

The process chamber (301) may comprise one or more reaction spaces (302). The reaction space (302) can occupy the entire process chamber or only a part of it. In particular, the reaction space (302) may be formed inside the plastic container (100). Preferably, the container is sealed. Alternatively or additionally, a further reaction space may be formed, for example on the outside of the container.

The reactor (300) may also comprise a plurality of process chambers (301) with one or more reaction spaces (302).

Depending on the structure of the coating (200), the size of the substrate (100) and the process control, the coating (200) is preferably deposited over a period of approximately 5-60 seconds. In the case of particularly large containers, longer process times may also occur. At least one gradient coat is deposited during the deposition process.

The mixing ratio of the process gas mixture (PGM) is changed during the process. In particular, the mass flow rate of the precursors (PG1, PG2) and/or the reactive gas (RG) is changed. By varying the process gases, the material composition of the coating (200) is influenced.

Figure 4:
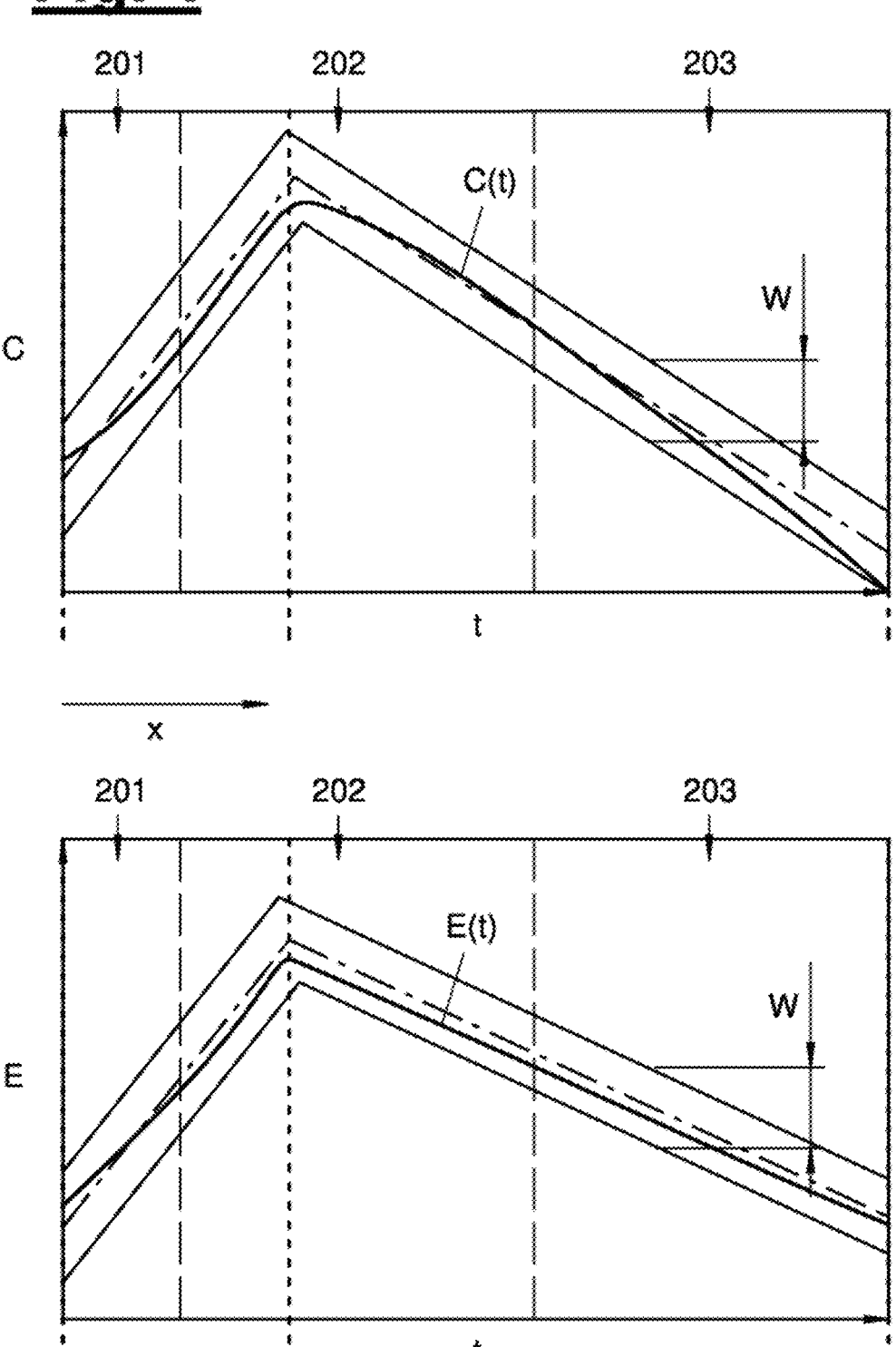
FIG. 4: Advantageous course of the process parameters C and E during the deposition of a gradient layer.

An advantageous progression of the process parameters is shown in FIG. 4.

Preferably, the reactive gas content (C) and/or the mass-related excitation energy (E) between the adhesion zone (201) and the barrier zone (202) is gradually increased along the layer build-up direction (x).

Alternatively or additionally, the reactive gas content (C) and/or the mass-related excitation energy (E) between the barrier zone (202) and the passivation zone (203) is gradually reduced along the layer build-up direction (x).

The variation of the reactive gas content (C) and the mass-related excitation energy (E) is preferably uniform, in particular stepless.

Particularly advantageously, the excitation energy (E) is controlled as a function of the composition of the process gas mixture (PGM), in particular as a function of the precursor gas mass flow and/or the reactive gas mass flow.

Several options are available to the person skilled in the art for controlling the mass-related excitation energy. In particular, the average pulse power can be set. Advantageously, the power of the energy source and/or the pulse parameters are controlled. It is particularly advantageous to calculate a setpoint for the mass-related excitation energy (E) and to control or regulate this with one or more manipulated variables, e.g. a selection or combination of (nominal) power supply, pulse on-time, pulse off-time or pulse rate.

Figure 2:
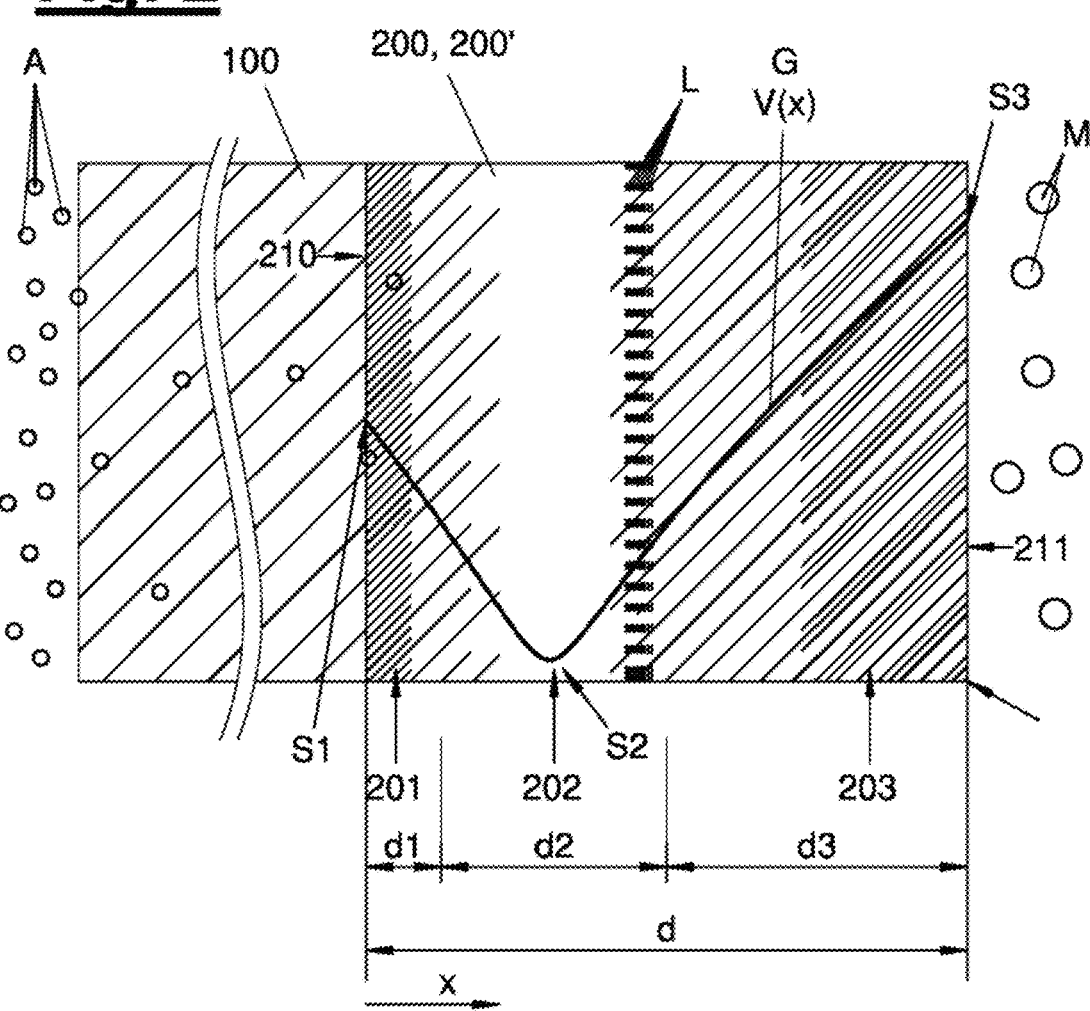
FIG. 2: Structure of a gradient coat (3-zone coat)

FIG. 2 shows a schematic structure of a coating (200) with a gradient coat (200') as a 3-zone layer. The coating (200) is deposited on the plastic substrate (100). The deposition, i.e. the build-up in nanolayers (L), of the coating takes place along the layer build-up direction (x).

The thickness of a suitable coating (d) is preferably in the range between 80-1000 nanometers. The plastic substrate (100) is several orders of magnitude thicker. Common wall thicknesses for plastic containers are in the millimeter range. The plastic substrate is therefore shown broken for the sake of common representability.

In a 3-zone layer (FIG. 2), an organically characterized adhesion zone (201) is first deposited on the substrate (100). An oxidically characterized barrier zone (202) is then deposited on the adhesive zone (201), with the zones merging smoothly into one another. An organically characterized passivation zone (203) is deposited on the barrier zone (202).

In the case of a 2-zone layer, the barrier zone (202) can also be deposited directly on the substrate.

The gradient coat (200') comprises at least a barrier zone (202) and a passivation zone (203). The passivation zone (203) is arranged between the environment face (211) of the coating (200) and the barrier zone (202). The passivation zone (203) protects the barrier zone (202). The passivation zone is resistant to the influence of aggressive media (M).

The coating (200) forms a migration barrier, i.e. also a diffusion barrier, for ambient gases (A) that can diffuse through the plastic substrate (100). By forming one or more barrier zones (202), permeation paths are interrupted. The oxidic barrier zone (202) acts as a migration barrier.

The gradient coat (200') is built up in a large number of nanolayers (L) during the deposition process. The material composition of the individual nanolayers (L) changes gradually along the layer build-up direction (x).

The gradient (G) schematically shows the gradual progression of the material composition of the gradient coat.

The individual zones, i.e. the adhesion zone (201), the barrier zone (202) and the passivation zone (203), can be described on the basis of their material composition and the proportion of certain bond types. The respective center of the zone can be considered representative of the gradually changing composition in a particular zone. The respective center (S1, S2, S3) of a zone can be regarded as a certain nanolayer (L) at an extremum of a certain property curve, e.g. the gradient (G), along the layer build-up direction (x).

The chemical structure of the gradient coats is defined by the extremes (centers), in particular local or global maxima or minima, at which the maximum coating properties for the respective coating type have been set, so that the process control is henceforth aligned to achieve the next extremum. The chemical structure at the extreme points (S1, S2, S3) is described in more detail below. Table 1 shows the preferred elemental compositions of the layers at the extremes, which were determined using X-ray photoelectron spectroscopy (XPS).

TABLE 1

| XPS data on the extremes of the material composition when using HMDSO and HMDSN as precursor | | | |
| --- | --- | --- | --- |
| | Element | | |
| Layer | C-1s [at %] | O-1s [at %] | Si 2p [at %] |
| Center adhesion zone (201) | 44 | 35 | 21 |
| Center barrier zone | 3 | 70 | 27 |
| Center passivation zone | 56 | 23 | 21 |

Fourier transform infrared spectroscopy (FT-IR) is used to further characterize the chemical structure of the various zones, especially the centers of the respective zones. Table 2 lists the vibration modes that are important for evaluating the FTIR measurements.

TABLE 2

| Vibration mode and FT-IR peak position | | |
| --- | --- | --- |
| A | $b_{sym}$ $CH_3$ | 1376 cm$^{-1}$ |
| B | $s_{sym}$ $CH_3$ | 1257 cm$^{-1}$ |
| C | Si—O—Si | 440 cm$^{-1}$ |
| | | 1010-1035 cm$^{-1}$ |
| | | 1070 cm$^{-1}$ |

TABLE 2-continued

| Vibration mode and FT-IR peak position | | |
|---|---|---|
| D | $s_{sym}$ Si—OH | 930 cm$^{-1}$ |
| E | r Si—CH$_3$, b Si(CH3)$_3$ | 839 cm$^{-1}$ |

In Table 2, the prefixes: s = stretching; b = bending; r = rocking; and the subscript: sym = symmetrical.

Figure 5:
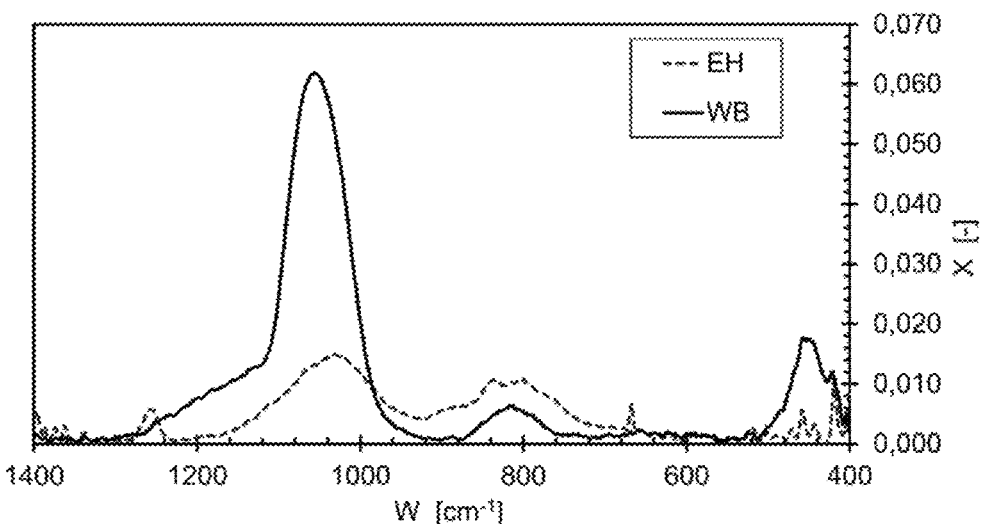
FIG. 5: FT-IR spectra at the centers of an adhesion zone (EH) and a barrier zone (WB)
Figure 6:
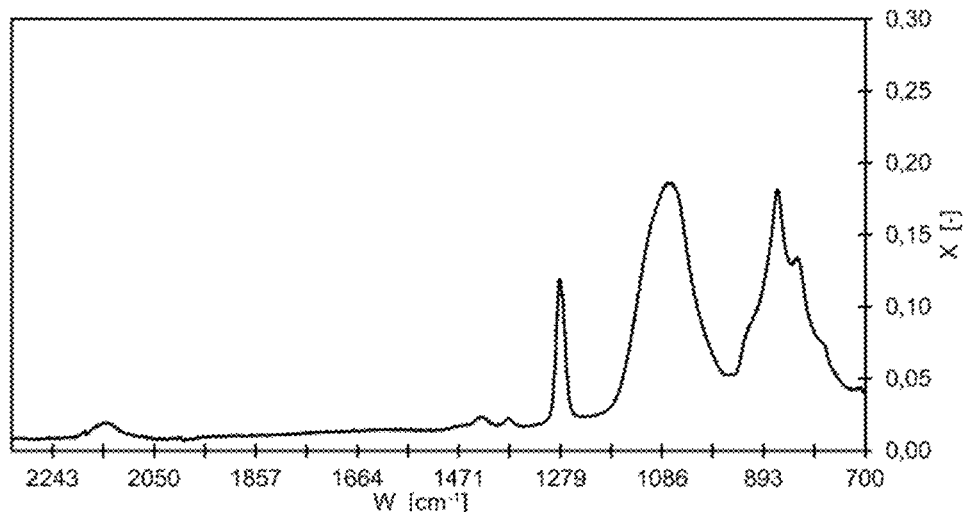
FIG. 6: FT-IR spectra at the center of a passivation zone.

FIGS. 5 and 6 show exemplary FT-IR spectra of the extremes of the respective zones. The parameter W denotes the wavenumber with the unit cm$^{-1}$ and the dimensionless parameter X denotes the extinction.

FIG. 5 shows FT-IR spectra at a centroid of an HMDSO-based adhesion promoter zone (EH) and at a centroid of an HMDSN-based barrier zone (WB).

The coating at the extremum of the barrier zone (WB), cf. centroid S2 in FIG. 2, exhibits a strongly pronounced Si—O—Si network structure (440 cm$^{-1}$ and 1070 cm$^{-1}$). The broadband peak between 900 and 1,300 cm$^{-1}$ can mainly be assigned to three anti-symmetric Si—O stretching vibrations in Si—O—Si compounds. The peak around 1135 cm$^{-1}$ can be assigned to a Si—O—Si cage structure with bond angles of about 150°. Network structures with bond angles around 144° are assigned to the peak around 1070 cm$^{-1}$. If the structures have smaller bond angles than 144°, it is assumed that there are suboxides in the networks (1010-1030 cm$^{-1}$). The peak at 839 cm$^{-1}$ is characteristic of stretching vibrations and rocking vibrations of methyl groups and shows that a higher retention of these functional groups from the monomer is achieved at a focal point of the adhesion promoter zone (EH) compared to the barrier zone (WB), which gives this zone an organic character.

The intensity and exact peak position of the peak of the Si—O—Si network provides information about the degree of crosslinking of the layers. A higher peak maximum position indicates a higher Si—O—Si crosslinking. Such a peak shift can be clearly seen in the comparison of the two spectra. The barrier zone (WB) is a highly cross-linked coating with a pronounced Si—O—Si network structure in which little C and C—H are bound.

FIG. 6 shows an exemplary FT-IR spectrum of a center of a passivation zone. The figure shows the FT-IR spectrum of an HMDSO-based passivation zone (EP).

Similar to the spectrum of the adhesion zone (EH) in FIG. 5, the spectrum of the passivation zone in FIG. 6 shows three particularly pronounced peaks. The peak in the range of approx. 700-900 cm$^{-1}$ is composed of the superposition of a series of individual peaks. The peak at the wavenumber of 1070 cm$^{-1}$ is also due to stretching vibrations of the Si—O—Si network. The peak at 1257 cm$^{-1}$ is characteristic of symmetric stretching vibrations of methyl groups.

The chemical structure of the zones is of outstanding importance, especially with regard to the barrier performance of the barrier zone and the hydrolytic stability of the passivation zone.

To characterize the chemical structure of the zones, the structure parameter V is therefore also introduced, which represents the ratio of the areas (Gaussian curves) under the peaks measured by FT-IR, each of which can be clearly assigned to CHs or Si—O groups (the assignment of the peaks can be found in Table 2):

$$V = \frac{A + B + E}{C + D}$$

V: Structure parameter [-]
A: Extinction X [-] an W=1376 cm$^{-1}$
B: Extinction X [-] an W=1257 cm$^{-1}$
E: Extinction X [-] an W=839 cm$^{-1}$
C: Extinction X [-] an W=440 cm$^{-1}$, 1010 cm$^{-1}$ bis 1035 cm$^{-1}$, 1070 cm$^{-1}$
D: Extinction X [-] an W=930 cm$^{-1}$ In terms of chemical structure, the barrier performance of the barrier zone is primarily determined by the degree of cross-linking and oxidation of the layers. An advantageous range of V<0.2 and a particularly advantageous range of V<0.05 was determined for the extremum of the barrier zone (WB).

The chemical resistance of the passivation zone is explained by considering the electronegativity of the elements involved in the coating material, which can be used to evaluate the local partial charge shifts of the bonds. The higher the difference in the electronegativity of the bonding partners, the more strongly the bonding electrons are localized to the bonding partner with higher electronegativity. As a result, this element experiences an electron boost.

Among the bonds present in the layers, the oxygen in Si—O in particular experiences the greatest electron boost. As a result, oxygen carries negative (δ—) and silicon positive partial charges (δ+). The silicon therefore experiences a lack of electrons. Negatively charged ions in solution therefore attack the silicon bound with oxygen due to its positive partial charges. Si—CH$_3$ bonds in turn have low partial charges. The layer is therefore attacked nucleophilically by the ion at Si—O, for example. This results in Si—OH bonds under the bond breakage of the Si—O—Si bond. As a result, more and more gaps are created within the Si—O network with the introduction of anionic end groups. Weak bonds are sterically shielded by the CHs groups, which can significantly slow down or completely stop the reaction. The greater the ratio of CHs groups to Si—O, the slower the degradation of the layer can progress. The greater V, the more durable the coating. Preferably, at least one structural parameter V>0.20 and particularly advantageously a V>0.35 is achieved for the extremum of the passivation zone in order to be able to provide the necessary protective performance.

To deposit an advantageous adhesion promoter layer, a structure parameter V of 0.1<V<0.3 is achieved at the extremum of the adhesion promoter zone (EH).

The structural parameter V can be used to determine the oxidic or organic centers and/or the functional zones of a gradient coat. In FIG. 2, for example, a schematic curve of the structural parameter V(x) is plotted along the layer build-up direction x. The extrema (S1, S2, S3) of the structural parameter V(x) can be used to determine the centers of the gradient coat and the individual functional zones of a gradient coat.

The respective oxidic or organic center of a zone can be located at the edge or in the middle of the zone, depending on the layer architecture. The transitions between the zones are fluid.

The zones are preferably determined by their material composition. The material composition of the individual nanolayers determines the function of the layer zones.

Various types of analysis can be used to delimit the zones (201, 202, 203), e.g. to determine the thicknesses (d1, d2, d3). For example, the material composition of the individual nanolayers can be determined in the SIMS process (secondary ion mass spectrometry) or furthermore in the nanoSIMS process. By bombarding the surface with ions, the layers can be removed and analyzed with nanometer resolution.

To define the thickness of the zones, the structural parameter V or the elemental composition of the nanolayers along the layer build-up direction can be determined. If the proportion of organic compounds predominates, the position can be assigned to the passivation or adhesion zone. If oxidic compounds predominate, the position can be assigned to the barrier zone.

The material composition of two neighboring nanolayers (L) is always similar. The material similarity of the individual nanolayers (L) favors homogeneous layer growth.

The advantage of the gradual structure of the zones of the gradient coat is that each nanolayer (L) finds a chemically similar basis during deposition. The chemical properties of the nanolayers change only gradually. This prevents island growth.

Figure 3:
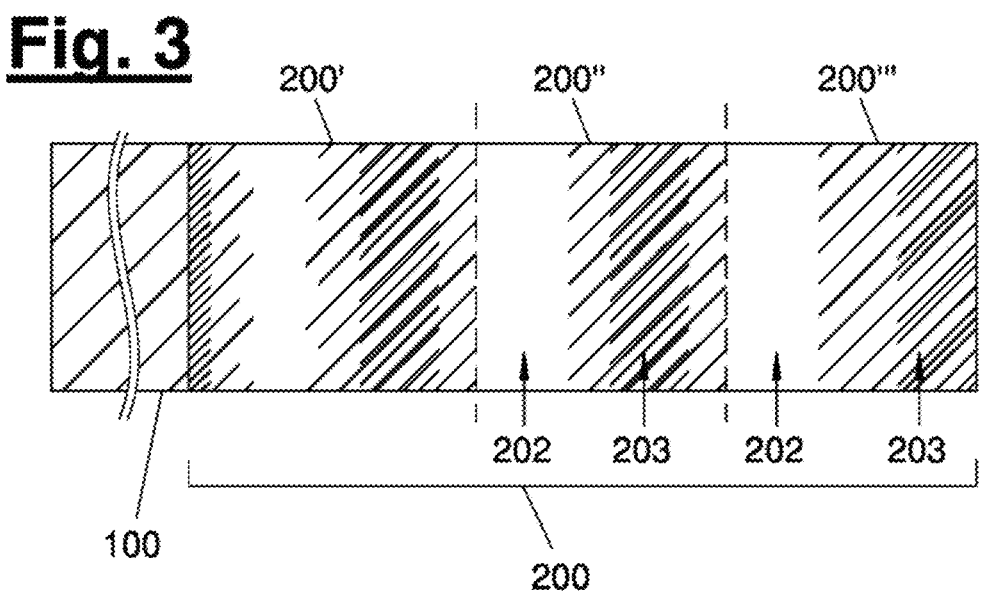
FIG. 3: Structure of a coating with several gradient coats.

FIG. 3 shows an exemplary structure of a coating (200) with several gradient coats (200', 200'', 200'''). The structure of the gradient coats or the individual zones can be repeated along the layer build-up direction. Preferably, the zones between two successive gradient coats (200', 200'') also gradually merge into one another.

The multi-layer structure of the gradient coats can be particularly advantageous in order to strengthen the migration barrier and/or the chemical resistance, i.e. the protection of the barrier zone. Alternatively or additionally, the low thicknesses of the individual zones can nevertheless be maintained, which favors the homogeneous layer growth and the mechanical properties (e.g. low layer stresses) of the coating.

In an example not specifically shown, the coating (200) can also comprise a gradient coat (200''') with only one barrier zone (202) and one passivation zone (203). In particular for PET substrates, the adhesion zone (201) can be omitted.

In the case of a 2-zone layer (200'''), the barrier zone (202) is preferably arranged directly on the plastic substrate (100) or on an intermediate gradient coat (200', 200''). In the case of a 2-zone layer, the barrier zone (202) can in particular have an oxidic center located at the edge of the zone.

FIG. 4 shows an advantageous course of the reactive gas content (C) or the mass-related excitation energy (E) during the deposition of a gradient coat (200') with an adhesion zone (201), a barrier zone (202) and a passivation zone (203).

In particular, the process variables C and E can each be controlled or regulated in a specific process window (W).

The adhesion zone (201) is deposited with a low to medium reactive gas content (C). In an advantageous example, at least a small amount of oxygen is added at the start of the process. The surface of the plastic substrate (210) is activated by the resulting oxygen-rich plasma. In this way, prior surface activation of the substrate (100) can be omitted, which can shorten the process times. The activation of the surface improves the adhesion of the coating (200) to the substrate surface.

The adhesion zone (201) protects sensitive plastic substrates (100), in particular polyolefins, from the oxidic barrier zone (202). In this respect, the adhesion zone (201) has a protective effect for the plastic substrate.

The gradual variation of the reactive gas content (C) and/or the mass-related excitation energy (E) controls the gradient (G) of the material composition of the deposited layer and favors homogeneous and pore-free layer growth.

In certain phases of the deposition process, the proportion of (at least one) reactive gas (RG) in the process gas mixture can be between 0 and 100%. It may be appropriate to use a very high reactive gas content (C), preferably $50 \leq C \leq 100$, to deposit a strongly oxidized area. Alternatively or additionally, it may be expedient to use a low reactive gas content (C) or no reactive gas at all for an organic region of the gradient coat.

In an advantageous example, the excitation energy (E) of the plasma is controlled as a function of the current process gas composition. It is particularly advantageous to keep the energy introduced per particle mass within a certain range and to adapt this range to the changed reactive gas content.

By changing the reactive gas content, a wide range of material compositions between the oxidic and organic centers of the gradient coat can be achieved. As a result, particularly strong barrier effects and passivation effects can be achieved, which enable a sufficient migration barrier and chemical resistance for containers of aggressive media.

By adjusting the mass-related excitation energy (E), the excitation and thus the reaction can be kept in an optimum range for homogeneous layer growth (despite strongly varying gas composition). This means that volume polymerization in particular can be avoided. This enables pore-free layer deposition.

The individual features of the examples described, illustrated or claimed here can also be combined with one another. Features can be replaced or supplemented by individual features of the other examples.

REFERENCE SIGNS 100 plastic substrate
200 coating
200' gradient coat
201 contact zone
202 barrier zone
203 passivation zone
210 Substrate face, substrate surface
211 environment face
S1 organic center
S2 oxidic center
S3 organic center
300 reactor
301 process chamber
302 reaction space
310 pump
320 gas supply
321 gas flow controller
350 energy source, magnetron
351 microwaves
352 plasma
PGM process gas mixture
PG precursor, polysiloxane
PG1 (first) precursor, HMDSN
PG2 (second) precursor, HMDSO
RG reactive gas, oxygen
A ambient gases
C reactive gas content
E excitation energy, mass-related
Fc corrected process gas flow
G gradient
K correction factor
L nanolayer
M medium
P Power supply
r Resolution
RGF Reactive gas mass flow
PGF Precursor gas mass flow
ton Pulse on-time
toff Pulse off-time W process window
x Layer build-up direction

The invention claimed is:

1. A method for production of a coating for producing a chemically resistant migration barrier on a plastic substrate, by means of plasma-enhanced chemical vapor deposition (PECVD) wherein a process gas mixture is fed into a reaction space; and is excited by means of an energy source with an excitation energy to form a plasma, the process gas mixture having an adjustable composition of one or more precursors and/or one or more reactive gases, characterized in that a gradient coat with an adhesion zone, a barrier zone and a passivation zone or a gradient coat with a barrier zone and a passivation zone is deposited on the plastic substrate in which a gradient coat chemical configuration changes along a layer build-up direction between organic and oxidic, wherein the deposition of the gradient coat is controlled by varying a reactive gas content in the process gas mixture, and wherein the excitation energy is controlled on a mass-related basis as a function of a precursor gas mass flow and a reactive gas mass flow, a mass-related excitation energy being reduced along the layer build-up direction for a deposition of an organically characterized passivation zone on an oxidically characterized barrier zone.

2. The method of claim 1, wherein one or more pulse parameters of the energy source are kept constant at least temporarily during the deposition of the gradient coat.

3. The method of claim 2, wherein the one or more pulse parameters comprises a quotient of a pulse on-time and a pulse off-time of excitation pulses.

4. The method of claim 2, wherein the one or more pulse parameters are kept constant during the deposition of the adhesion zone and/or the barrier zone.

5. The method of claim 1, wherein the reactive gas content and/or the mass-related excitation energy is increased between the adhesion zone and the barrier zone along the layer build-up direction.

6. The method of claim 1, wherein the reactive gas content is reduced between the barrier zone and the passivation zone along the layer build-up direction.

7. The method of claim 1, wherein the excitation energy is controlled as a function of a particle mass involved in a deposition reaction.

8. The method of claim 1, wherein the plasma is excited by pulsed microwaves.

9. The method of claim 1, wherein a power supply or one or more pulse parameters, in particular a pulse on-time (ton), and/or a pulse off-time (toff of an excitation is controlled in order to vary the excitation energy.

10. The method of claim 9, wherein the one or more pulse parameters comprises a pulse rate or a pulse ratio.

11. The method of claim 1, wherein during the deposition of the barrier zone the reactive gas content (C) is $25 \leq C \leq 250$ and/or the mass-related excitation energy (E) is $400$ kJ/kg$\leq$E$\leq$2700 kJ/kg.

12. The method of claim 1, wherein during the deposition of the passivation zone the reactive gas content (C) is $0 < C \leq 20$ and/or the mass-related excitation energy (E) is $30$ kJ/kg$\leq$E$\leq$1700 kJ/kg.

13. The method of claim 1, wherein during deposition of the adhesion zone the reactive gas content (C) is $0 < C \leq 50$ and/or the mass-related excitation energy (E) is $20$ kJ/kg$\leq$E$\leq$200 kJ/kg.

14. The method of claim 1, wherein the process gas mixture comprises one or more silicon-containing precursors.

15. The method of claim 14, wherein the process gas mixture comprises organosilicon compounds, siloxanes, silazanes, or silanes.

16. The method of claim 15, wherein the process gas mixture comprises hexamethyldisiloxane (HMDSO) and/or hexamethyldisilazane (HMDSN).

17. The method of claim 1, wherein the one or more reactive gases comprises oxygen and/or nitrogen.

18. The method of claim 1, wherein hexamethyldisilazane (HMDSN) is used as a precursor for depositing the barrier zone.

19. The method of claim 1, wherein hexamethyldisiloxane (HMDSO) is used as a precursor for depositing the adhesion zone and/or the passivation zone.

* * * * *